(12) United States Patent
Masunari et al.

(10) Patent No.: US 9,967,980 B2
(45) Date of Patent: May 8, 2018

(54) ELECTRONIC COMPONENT, MOUNTED ELECTRONIC COMPONENT, AND METHOD FOR MOUNTING ELECTRONIC COMPONENT

(71) Applicant: Murata Manufacturing Co., Ltd., Nagaokakyo-shi, Kyoto-fu (JP)

(72) Inventors: Akio Masunari, Nagaokakyo (JP); Hirokazu Takashima, Nagaokakyo (JP); Tomoyuki Nakamura, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days. days.

(21) Appl. No.: 15/389,484

(22) Filed: Dec. 23, 2016

(65) Prior Publication Data

US 2017/0208691 A1 Jul. 20, 2017

(30) Foreign Application Priority Data

Jan. 15, 2016 (JP) .................. 2016-006292

(51) Int. Cl.

| | |
|---|---|
| H05K 1/09 | (2006.01) |
| H05K 1/18 | (2006.01) |
| H01G 4/005 | (2006.01) |
| H01G 4/12 | (2006.01) |
| H01G 4/248 | (2006.01) |
| H01G 4/30 | (2006.01) |
| H05K 1/11 | (2006.01) |
| H05K 3/34 | (2006.01) |

(52) U.S. Cl.
CPC .............. *H05K 1/181* (2013.01); *H01G 4/005* (2013.01); *H01G 4/12* (2013.01); *H01G 4/248* (2013.01); *H01G 4/30* (2013.01); *H05K 1/09* (2013.01); *H05K 1/111* (2013.01); *H05K 3/3421* (2013.01); *H05K 3/3426* (2013.01); *H05K 2201/10015* (2013.01); *H05K 2201/10287* (2013.01); *H05K 2201/10636* (2013.01); *H05K 2203/048* (2013.01); *H05K 2203/049* (2013.01); *Y02P 70/611* (2015.11); *Y02P 70/613* (2015.11)

(58) Field of Classification Search
CPC .. H01G 4/05; H01G 4/06; H01G 4/12; H01G 4/18; H01G 4/20; H01G 4/30; H01G 4/228; H01G 4/232; H01G 4/248; H05K 1/09; H05K 1/111; H05K 1/181
USPC ................ 174/257; 361/306.1, 321.2, 321.4; 257/487, 700
See application file for complete search history.

(56) References Cited

U.S. PATENT DOCUMENTS 4,586,972 A * 5/1986 Yokotani ................. B32B 18/00
156/89.12
4,889,760 A * 12/1989 Kippenberg ......... H01C 1/1406
156/89.17

(Continued)

FOREIGN PATENT DOCUMENTS

JP 2001-338838 A 12/2001

*Primary Examiner* — Xiaoliang Chen
(74) *Attorney, Agent, or Firm* — Keating & Bennett, LLP

(57) ABSTRACT

A multilayer ceramic capacitor includes a ceramic element body including first and second external electrodes on first and second end surface sides of the ceramic element body, respectively. The first external electrode includes an Ni plating layer and an Sn plating layer defining a plating layer. The second external electrode includes an Au plating layer defining a plating layer.

9 Claims, 3 Drawing Sheets

(56) References Cited

U.S. PATENT DOCUMENTS

| | | | | |
|---|---|---|---|---|
| 2002/0158329 A1* | 10/2002 | Kimura | ................. | C04B 41/009 |
| | | | | 257/700 |
| 2005/0041369 A1* | 2/2005 | Kimura | ................. | H01G 4/228 |
| | | | | 361/321.4 |
| 2008/0224816 A1* | 9/2008 | Inoue | .................... | H01C 7/102 |
| | | | | 338/21 |
| 2010/0110608 A1* | 5/2010 | Wei | .................... | C04B 35/4682 |
| | | | | 361/321.4 |
| 2011/0141657 A1* | 6/2011 | Jeon | ...................... | H01B 1/026 |
| | | | | 361/321.1 |
| 2012/0161576 A1* | 6/2012 | Motoki | .................. | H01G 4/005 |
| | | | | 310/311 |
| 2014/0111300 A1* | 4/2014 | Park | ....................... | H01G 4/30 |
| | | | | 338/22 R |
| 2016/0039711 A1* | 2/2016 | Miyazaki | ............. | H01G 4/2325 |
| | | | | 361/301.4 |
| 2016/0086733 A1* | 3/2016 | Saito | .................... | H01G 4/0085 |
| | | | | 361/301.4 |

* cited by examiner

ELECTRONIC COMPONENT, MOUNTED ELECTRONIC COMPONENT, AND METHOD FOR MOUNTING ELECTRONIC COMPONENT

CROSS REFERENCE TO RELATED APPLICATIONS

This application claims the benefit of priority to Japanese Patent Application No. 2016-006292 filed on Jan. 15, 2016. The entire contents of this application are hereby incorporated herein by reference.

BACKGROUND OF THE INVENTION

1. Field of the Invention

The present invention relates to an electronic component, a mounted electronic component, and a method for mounting an electronic component. In particular, the present invention relates to an electronic component to be mounted, for example, in a mobile phone, a digital camera, or the like, a mounted electronic component including the electronic component mounted on a substrate, and a method for mounting the electronic component on the substrate.

2. Description of the Related Art

As a conventional electronic component, one example of a multi-functional electronic component is disclosed, for example, in Japanese Patent Laying-Open No. 2001-338838. The multi-functional electronic component disclosed in Japanese Patent Laying-Open No. 2001-338838 is a multi-functional electronic component configured such that, in a chip-type capacitor having conductor electrodes for mounting provided on two facing surfaces, a resistor is provided on an insulating layer surface other than the surfaces provided with the conductor electrodes for mounting, and thereby the capacitor and the resistor are connected in parallel between the conductor electrodes for mounting.

The multi-functional electronic component disclosed in Japanese Patent Laying-Open No. 2001-338838 has been devised for the purpose of providing a multi-functional electronic component having a plurality of mounted components with different electric functions configured as one electronic component.

However, a conventional electronic component such as the multi-functional electronic component disclosed in Japanese Patent Laying-Open No. 2001-338838 has been required to be able to be effectively mounted in a limited mounting space in a mobile phone, a digital camera, or the like, for example.

SUMMARY OF THE INVENTION

Accordingly, preferred embodiments of the present invention provide an electronic component that is able to be effectively mounted in a limited mounting space, a mounted electronic component including an electronic component mounted on a substrate, and a method for mounting an electronic component on a substrate.

An electronic component according to a preferred embodiment of the present invention includes a ceramic element body with a length extending in a longitudinal direction; a first external electrode located on a first end side in the longitudinal direction of the ceramic element body; and a second external electrode located on a second end side in the longitudinal direction of the ceramic element body, the first external electrode including an Ni plating layer located on the ceramic element body and an Sn plating layer located on the Ni plating layer, and the second external electrode including an Au plating layer located on the ceramic element body.

A mounted electronic component according to a preferred embodiment of the present invention is a mounted electronic component including a substrate; a mounting land electrode located on a first main surface of the substrate; a wire bonding land electrode located on the first main surface of the substrate and spaced from the mounting land electrode; and an electronic component mounted on the substrate, the electronic component including a ceramic element body with a length extending in a longitudinal direction, a first external electrode located on a first end side in the longitudinal direction of the ceramic element body, and a second external electrode located on a second end side in the longitudinal direction of the ceramic element body, the first external electrode of the electronic component being connected to the mounting land electrode with solder, the second external electrode of the electronic component being connected to the wire bonding land electrode via a bonding wire, the electronic component being mounted such that the longitudinal direction of the ceramic element body is perpendicular or substantially perpendicular to the first main surface of the substrate.

A method for mounting an electronic component according to a preferred embodiment of the present invention is a method for mounting an electronic component on a substrate, the electronic component including a ceramic element body with a length extending in a longitudinal direction, a first external electrode located on a first end side in the longitudinal direction of the ceramic element body, and a second external electrode located on a second end side in the longitudinal direction of the ceramic element body, the method including preparing the substrate including a first main surface on which a mounting land electrode and a wire bonding land electrode are spaced from each other; applying a cream solder to the mounting land electrode; laterally arranging the electronic component on the substrate such that the first external electrode of the electronic component is located on the mounting land electrode; melting the cream solder and causing the electronic component to stand up on the mounting land electrode due to a surface tension of the cream solder; connecting the first external electrode of the electronic component to the mounting land electrode with solder by solidifying the cream solder; and connecting the second external electrode of the electronic component to the wire bonding land electrode via a bonding wire by wire bonding.

An electronic component according to a preferred embodiment of the present invention is able to be mounted on the substrate, for example, by a method such as the method for mounting an electronic component according to a preferred embodiment of the present invention, as with the mounted electronic component according to a preferred embodiment of the present invention. In this case, since the electronic component is mounted such that the longitudinal direction of the ceramic element body is perpendicular or substantially perpendicular to the one main surface of the substrate, a mounting space for the electronic component is able to be significantly reduced in size or minimized. Accordingly, the electronic component is able to be effectively mounted in a limited mounting space.

Further, in an electronic component according to a preferred embodiment of the present invention, the first external electrode defines and functions as a barrier layer because it includes the Ni plating layer, and the first external electrode is also easily connected to the mounting land electrode with solder because it includes the Sn plating layer.

Furthermore, in an electronic component according to a preferred embodiment of the present invention, the second external electrode is easily connected to the wire bonding land electrode via the bonding wire because it includes the Au plating layer.

According to various preferred embodiments of the present invention, electronic components are able to be effectively mounted in a limited mounting space in a mobile phone, a digital camera, or the like, for example.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
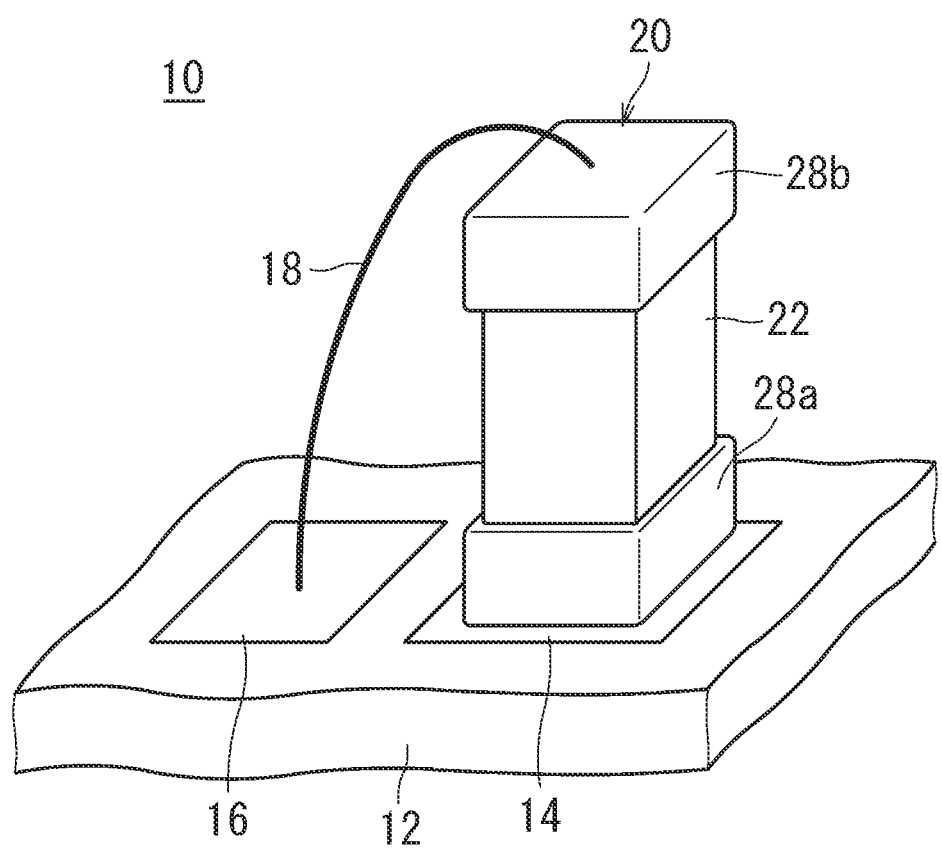
FIG. 1 is a main portion perspective view showing one example of a mounted electronic component including a multilayer ceramic capacitor, which is one example of an electronic component according to a preferred embodiment of the present invention, mounted on a substrate.

FIG. 1 is a main portion perspective view showing one example of a mounted electronic component including a multilayer ceramic capacitor, which is one example of an electronic component according to a preferred embodiment of the present invention, mounted on a substrate. A mounted electronic component 10 shown in FIG. 1 includes a flat plate-shaped substrate 12 made of an insulator. On a first main surface of substrate 12, a mounting land electrode 14 used for mounting is provided. The mounting land electrode 14 is made of an electrode material and has a shape of, for example, a rectangle. Further, on the first main surface of the substrate 12, a wire bonding land electrode 16 use for wire bonding is spaced from the mounting land electrode 14. The wire bonding land electrode 16 is made of an electrode material and preferably has a shape of, for example, a rectangle that is smaller than the mounting land electrode 14. A multilayer ceramic capacitor 20 as an electronic component is mounted on the substrate 12.

Figure 2:
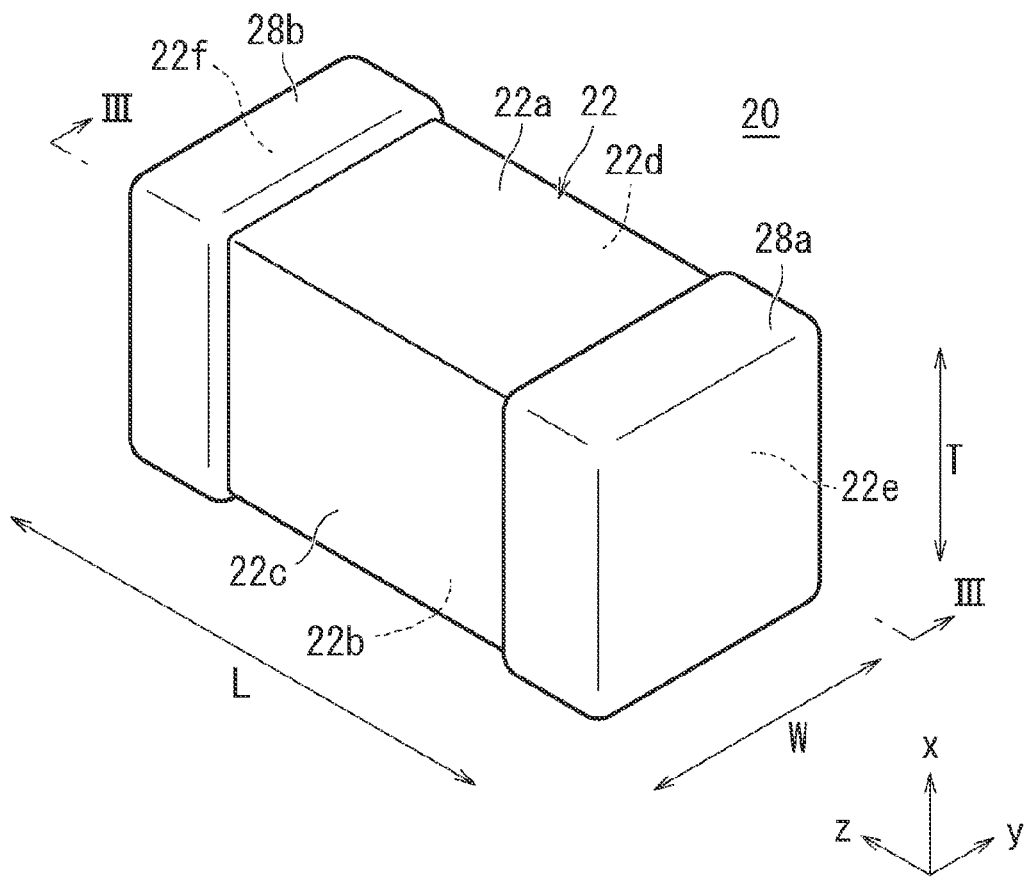
FIG. 2 is a perspective view showing the multilayer ceramic capacitor of the mounted electronic component shown in FIG. 1.
Figure 3:
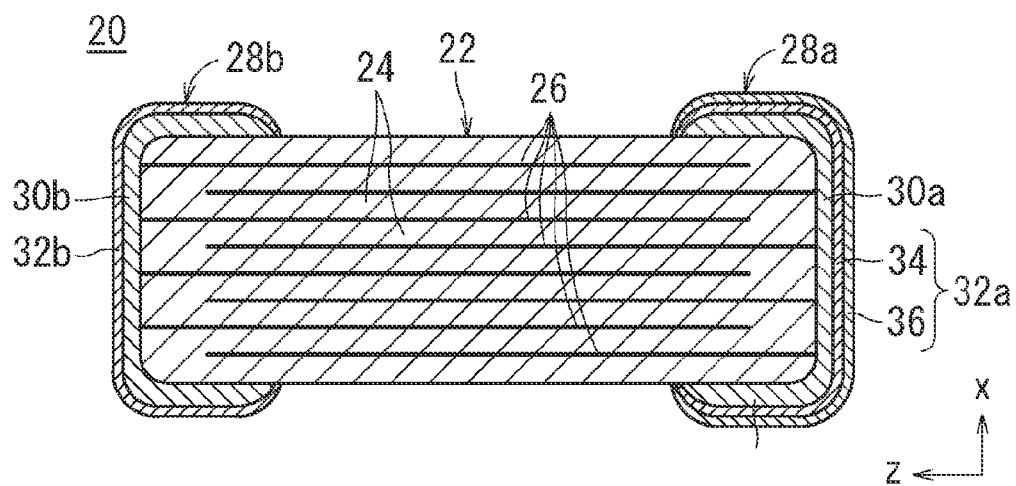
FIG. 3 is a cross sectional view showing an internal structure of the multilayer ceramic capacitor shown in FIG. 2.

FIG. 2 is a perspective view showing the multilayer ceramic capacitor 20 of the mounted electronic component 10 shown in FIG. 1, and FIG. 3 is a cross sectional view showing an internal structure of the multilayer ceramic capacitor 20 shown in FIG. 2.

The multilayer ceramic capacitor 20 includes a ceramic element body 22 with a length extending in a longitudinal direction and having a shape of, for example, a rectangular parallelepiped or a substantially rectangular parallelepiped. The ceramic element body 22 includes a plurality of ceramic layers 24 and a plurality of internal electrodes 26 stacked. In the ceramic element body 22, a first main surface 22a and a second main surface 22b facing each other in a layer-stacking direction x, and a first side surface 22c and a second side surface 22d facing each other in a width direction y perpendicular or substantially perpendicular to the layer-stacking direction x are formed along the longitudinal direction, and a first end surface 22e and a second end surface 22f facing each other in a length direction z perpendicular or substantially perpendicular to the layer-stacking direction x and the width direction y are provided at both ends of the longitudinal direction. Preferably, corner portions and ridge line portions of ceramic element body 22 are rounded.

The ceramic element body 22 is formed preferably by alternately stacking the plurality of ceramic layers 24 and the plurality of internal electrodes 26. The internal electrodes 26 include main surfaces facing the first main surface 22a and the second main surface 22b of the ceramic element body 22, and provided within ceramic element body 22 such that the main surfaces of adjacent pairs of the internal electrodes 26 face each other. The internal electrodes 26 alternately extend to the first end surface 22e and the second end surface 22f of the ceramic element body 22.

As a ceramic material of the ceramic layers 24, for example, a dielectric ceramic material including $BaTiO_3$, $CaTiO_3$, $SrTiO_3$, $CaZrO_3$, or the like as a main component can be used. Further, a ceramic material including an accessory component such as an Mn compound, an Fe compound, a Cr compound, a Co compound, an Ni compound, or the like added to a main component as described above may also be used.

In addition, as a material for internal electrodes 26, for example, Cu, Ni, Ag, Pd, an Ag—Pd alloy, Au, or the like can be used.

On the first end surface 22e side of the ceramic element body 22, a first external electrode 28a is connected to the internal electrodes 26. The first external electrode 28a extends from the first end surface 22e to the two main surfaces 22a and 22b and the two side surfaces 22c and 22d, of the ceramic element body 22.

Similarly, on the second end surface 22f side of the ceramic element body 22, a second external electrode 28b is connected to the internal electrodes 26. The second external electrode 28b extends from the second end surface 22f to the two main surfaces 22a and 22b and the two side surfaces 22c and 22d, of the ceramic element body 22.

The first external electrode 28a includes a base layer 30a and a plating layer 32a, in order from the one closer to the ceramic element body 22. Similarly, second external electrode 28b includes a base layer 30b and a plating layer 32b, in order from the one closer to the ceramic element body 22.

As a material for the base layers 30a and 30b, for example, Cu, Ni, Ag, Pd, an Ag—Pd alloy, Au, or the like can be used. The base layers 30a and 30b can be formed by applying a conductive paste to the end surfaces of the ceramic element body 22 prior to firing, and then performing firing, that is, by co-firing in which the base layer 30a of the first external electrode 28a and the base layer 30b of the second external electrode 28b are formed simultaneously with the formation of the ceramic element body 22 including the internal electrodes 26. The base layer 30a of the first external electrode 28a and the base layer 30b of the second external electrode 28b can also be formed by post-firing in which a conductive paste is applied to the end surfaces of the ceramic element body 22 subjected to firing, and then baked.

The plating layer 32a is formed on the base layer 30a. The plating layer 32b is formed on the base layer 30b. As a material for the plating layers 32a and 32b, for example, Cu, Ni, Ag, Pd, an Ag—Pd alloy, Au, or the like can be used.

The plating layers 32a and 32b may each be defined by a plurality of layers, for example. In this case, when the plating layers 32a and 32b each include a two-layer structure including an Ni plating layer as a lower layer and an Sn plating layer as an upper layer, such plating layers 32a and 32b are preferable because the Ni plating layer defines and functions as a barrier layer and the Sn plating layer improves solderability.

In addition, when the plating layers 32a and 32b each include an Au plating layer, such plating layers 32a and 32b are preferable because the Au plating layer improves bondability by wire bonding.

The plating layer 32a of the first external electrode 28a includes an Ni plating layer 34 on the base layer 30a, and an Sn plating layer 36 on the Ni plating layer 34. Accordingly, the first external electrode 28a defines and functions as a barrier layer and has a good solderability.

On the other hand, the plating layer 32b of the second external electrode 28b includes an Au plating layer on the base layer 30b. Accordingly, the second external electrode 28b has a good bondability by wire bonding.

By connecting the first external electrode 28a and the second external electrode 28b to alternate ones of the internal electrodes 26 as described above, an electrostatic capacitance is generated between the first external electrode 28a and the second external electrode 28b.

The multilayer ceramic capacitor 20 preferably has a shape of, for example, a rectangular parallelepiped with a length L (dimension in length direction z) of about 1.0 mm, a width W (dimension in width direction y) of about 0.5 mm, and a thickness T (dimension in layer-stacking direction x) of about 0.5 mm. It should be noted that each dimension includes a dimensional tolerance of about ±0.03 mm, for example.

The first external electrode 28a of the multilayer ceramic capacitor 20 is connected to the mounting land electrode 14 on the substrate 12 with solder. In this case, the multilayer ceramic capacitor 20 is mounted such that a length direction z, which is the longitudinal direction of the ceramic element body 22, is perpendicular or substantially perpendicular to a mounting surface, which is the one main surface, of the substrate 12. That is, the multilayer ceramic capacitor 20 is perpendicular or substantially perpendicular to the mounting surface of the substrate 12.

The second external electrode 28b of the multilayer ceramic capacitor 20 is connected to the wire bonding land electrode 16 via a bonding wire 18 made of, for example, Au, Al, Cu, or the like.

Next, a non-limiting example of a method for mounting the multilayer ceramic capacitor 20 as an electronic component on the substrate 12 as described above will be described.

Figure 4:
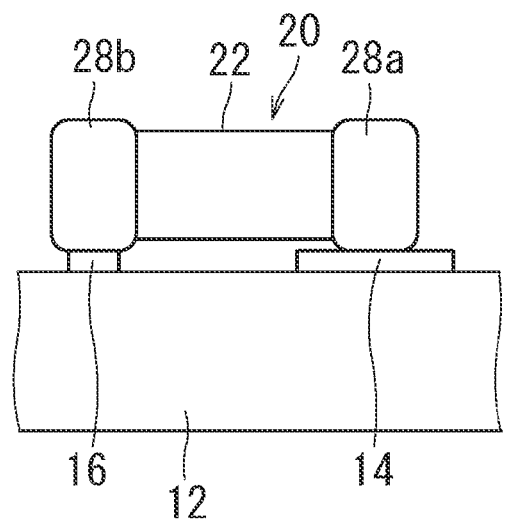
FIG. 4 is a diagram showing one step of a method for mounting the multilayer ceramic capacitor as the electronic component on the substrate in the mounted electronic component shown in FIG. 1.
Figure 5:
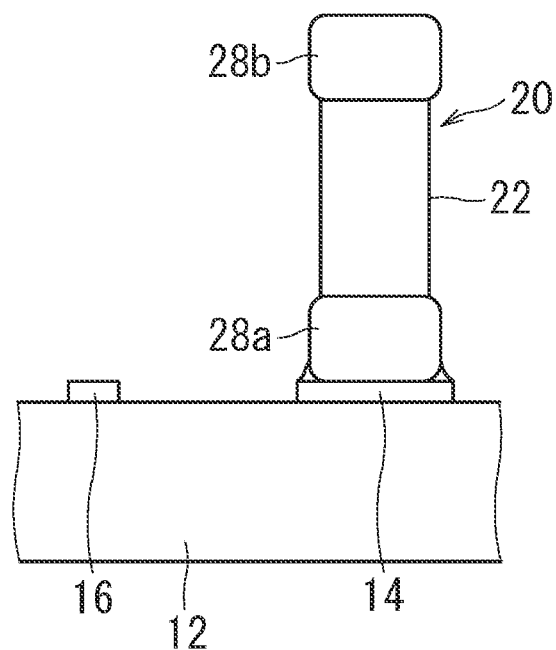
FIG. 5 is a diagram showing another step of the method for mounting the multilayer ceramic capacitor as the electronic component on the substrate in the mounted electronic component shown in FIG. 1.

FIG. 4 is a diagram showing one step of a method for mounting the multilayer ceramic capacitor 20 as the electronic component on the substrate 12 in the mounted electronic component 10 shown in FIG. 1, and FIG. 5 is a diagram showing another step of the method for mounting the multilayer ceramic capacitor 20 as the electronic component on the substrate 12 in the mounted electronic component 10 shown in FIG. 1.

In order to mount the multilayer ceramic capacitor 20 on the substrate 12, first, the substrate 12 including the one main surface on which the mounting land electrode 14 and the wire bonding land electrode 16 are formed to be spaced from each other is prepared, and a cream solder is applied only to the mounting land electrode 14 on the substrate 12.

Then, as shown in FIG. 4, the multilayer ceramic capacitor 20 is laterally arranged on the substrate 12. In this case, the multilayer ceramic capacitor 20 is laterally arranged such that first external electrode 28a of the multilayer ceramic capacitor 20 is located on the mounting land electrode 14.

Then, the cream solder is melted by heat generated during reflow, and, due to an unbalanced surface tension of the cream solder, the multilayer ceramic capacitor 20 is caused to stand up on the mounting land electrode 14 as shown in FIG. 5, with the mounting land electrode 14 on the substrate 12 serving as a starting point. In this case, the multilayer ceramic capacitor 20 is caused to stand up on the mounting land electrode 14, utilizing a so-called tombstone phenomenon.

Then, the heat of the cream solder is released to solidify the cream solder, thus connecting the first external electrode 28a of the multilayer ceramic capacitor 20 to the mounting land electrode 14 on the substrate 12 with solder.

Thereafter, the second external electrode 28b on a top surface side of the multilayer ceramic capacitor 20 is connected to the wire bonding land electrode 16 via the bonding wire 18 by wire bonding.

In the mounted electronic component 10, since the multilayer ceramic capacitor 20 as the electronic component is mounted such that the longitudinal direction of the ceramic element body 22 is perpendicular or substantially perpendicular to the one main surface of the substrate 12, a mounting space for the multilayer ceramic capacitor 20 is able to be reduced. In particular, in the mounted electronic component 10, the spacing between the mounting land electrode 14 and the wire bonding land electrode 16 is able to be narrowed, the wire bonding land electrode 16 is able to have an area smaller than that of the mounting land electrode 14, and the mounting area of the multilayer ceramic capacitor 20 facing substrate 12 is able to be reduced, when compared with a case where the multilayer ceramic capacitor 20 as the electronic component is mounted such that the longitudinal direction of the ceramic element body 22 is parallel to the one main surface of the substrate 12. Accordingly, the multilayer ceramic capacitor 20 is able to be effectively mounted in a limited mounting space.

Further, in the multilayer ceramic capacitor 20 of the mounted electronic component 10, the first external electrode 28a defines and functions as a barrier layer because it includes the Ni plating layer 34 located on the ceramic element body 22, and the first external electrode 28a is also easily connected to the mounting land electrode 14 with solder because it includes the Sn plating layer 36 located on the Ni plating layer 34.

Furthermore, in the multilayer ceramic capacitor 20 of the mounted electronic component 10, the second external electrode 28b is easily connected to the wire bonding land electrode 16 via the bonding wire 18 because it includes the plating layer 32a including an Au plating layer located on the ceramic element body 22.

It should be noted that, in the multilayer ceramic capacitor 20 of the mounted electronic component 10 described above, the conductive resin layers that provide stress relaxation may be formed between the base layer 30a and the plating layer 32a, and between the base layer 30b and the plating layer 32b.

Further, in the multilayer ceramic capacitor 20 of the mounted electronic component 10 described above, although the first external electrode 28a and the second external electrode 28b preferably include the base layers 30a and 30b, the base layers 30a and 30b do not have to be provided. In this case, the plating layers 32a and 32b may be directly formed on the surfaces of the ceramic element body 22.

Furthermore, in the multilayer ceramic capacitor 20 of the mounted electronic component 10 described above, although the first external electrode 28a preferably defines and functions as a barrier layer and has a good solderability, and the second external electrode 28b has a good bondability by wire bonding, the first external electrode 28a and the second external electrode 28b may be configured to have reverse functions and the like. In this case, the second external electrode 28b is connected to the mounting land electrode 14 with solder, and the first external electrode 28a is connected to the wire bonding land electrode 16 via the bonding wire 18. In addition, in this case, the multilayer ceramic capacitor 20 is reversely mounted perpendicular or substantially perpendicular to the mounting surface of the substrate 12.

Thus, in the multilayer ceramic capacitor as the electronic component, one external electrode on one end side in the longitudinal direction of the ceramic element body is connected to the mounting land electrode with solder, and the other external electrode on the other end side in the longitudinal direction of the ceramic element body is connected to the wire bonding land electrode via the bonding wire.

Further, in the mounted electronic component 10 described above, although the mounting land electrode 14 and the wire bonding land electrode 16 preferably have shapes of rectangles different in size, they may be formed to have other shapes or other sizes.

Furthermore, in the mounted electronic component 10 described above, although the multilayer ceramic capacitor 20 is preferably formed to have a specific size, it may be formed to have another size such as, for example, a length L of about 0.6 mm, a width W of about 0.3 mm, and a thickness T of about 0.3 mm.

Further, in the method for mounting the electronic component described above, although the second external electrode 28b of multilayer ceramic capacitor 20 is located on the wire bonding land electrode 16 when the multilayer ceramic capacitor 20 is laterally arranged on the substrate 12, the second external electrode 28b of the multilayer ceramic capacitor 20 may be located on a portion other than the wire bonding land electrode 16.

Furthermore, in the method for mounting the electronic component described above, although the multilayer ceramic capacitor 20 is caused to stand up utilizing a so-called tombstone phenomenon, the multilayer ceramic capacitor 20 may be mounted using a chip mounter, without utilizing the tombstone phenomenon.

Although the multilayer ceramic capacitor 20 is used as an electronic component in the mounted electronic component 10 described above, the present invention is applicable to not only a capacitor such as a multilayer ceramic capacitor, but also other electronic components including an inductor such as a multilayer ceramic inductor, a resistor, and the like.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A mounted electronic component, comprising:
   a substrate;
   a mounting land electrode located on one main surface of the substrate;
   a wire bonding land electrode located on the one main surface of the substrate and spaced from the mounting land electrode; and
   an electronic component mounted on the substrate; wherein
   the electronic component includes:
      a ceramic element body with a length extending in a longitudinal direction;
      a first external electrode on a first end in the longitudinal direction of the ceramic element body; and
      a second external electrode on a second end in the longitudinal direction of the ceramic element body; wherein
   the first external electrode of the electronic component is connected to the mounting land electrode with solder;
   the second external electrode of the electronic component is connected to the wire bonding land electrode via a bonding wire;
   the electronic component is mounted such that the longitudinal direction of the ceramic element body is perpendicular or substantially perpendicular to the one main surface of the substrate; and
   the length of the ceramic element body is the longest or greatest dimension of the ceramic element body.

2. The mounted electronic component according to claim 1, wherein the wire bonding land electrode is smaller than the mounting land electrode.

3. The mounted electronic component according to claim 1, wherein the wire bonding land electrode is made of one of Au, Al, and Cu.

4. The mounted electronic component according to claim 1, wherein the first external electrode includes an Ni plating layer located on the ceramic element body and an Sn plating layer located on the Ni plating layer.

5. The mounted electronic component according to claim 1, wherein the second external electrode includes an Au plating layer located on the ceramic element body.

6. The mounted electronic component according to claim 1, wherein the ceramic element body is a multilayer ceramic body.

7. The mounted electronic component according to claim 1, wherein the ceramic element body is rectangular parallelepiped or substantially rectangular parallelepiped.

8. The mounted electronic component according to claim 1, wherein the ceramic element body is a multilayer ceramic body.

9. The mounted electronic component according to claim 8, wherein the ceramic element body includes internal electrodes connected to respective ones of the first external electrode and the second external electrode.

* * * * *